United States Patent [19]

Singh et al.

[11] Patent Number: 5,078,791

[45] Date of Patent: Jan. 7, 1992

[54] FILM FORMING COMPOSITION

[75] Inventors: Brij P. Singh, North Royalton; Raj Subramaniam, Parma, both of Ohio

[73] Assignee: NanoFilm Corporation, Valley View, Ohio

[21] Appl. No.: 475,777

[22] Filed: Feb. 6, 1990

[51] Int. Cl.$^5$ .................. C09K 15/32; C09D 4/00
[52] U.S. Cl. ............... 106/287.14; 106/2; 106/10; 106/272; 106/271; 522/71; 522/80; 522/172
[58] Field of Search ............ 106/272, 287.12, 287.14, 106/271, 287.16, 287.18, 287.23–287.28, 287.3, 2, 287.1, 10; 522/71, 80, 172; 252/315.01

[56] References Cited

U.S. PATENT DOCUMENTS

| | | | |
|---|---|---|---|
| 2,130,560 | 9/1938 | Plechner et al. | 106/272 |
| 2,396,667 | 3/1946 | Adler | 106/272 |
| 3,508,933 | 4/1970 | Yates | 106/10 |
| 3,576,779 | 4/1971 | Holdstock et al. | 106/3 |
| 3,836,371 | 9/1974 | Kokoszka | 106/10 |
| 3,882,128 | 5/1975 | McLaren et al. | 106/271 |
| 4,035,514 | 7/1977 | Davis | 106/285 |
| 4,218,250 | 8/1980 | Kasprzak | 106/3 |
| 4,243,500 | 1/1981 | Glennon | 156/334 |
| 4,382,821 | 5/1983 | Davis et al. | 106/272 |
| 4,398,953 | 8/1983 | van der Linde | 106/272 |
| 4,404,306 | 9/1983 | Daudt et al. | 106/287.11 |
| 4,446,033 | 5/1984 | Barrat et al. | 252/8.6 |
| 4,631,273 | 12/1986 | Blehm et al. | 106/271 |
| 4,844,144 | 7/1989 | Murphy et al. | 264/22 |
| 4,851,043 | 7/1989 | Dotson et al. | 106/271 |
| 5,017,222 | 5/1991 | Cifuentes et al. | 106/10 |

*Primary Examiner*—Theodore Morris
*Assistant Examiner*—David M. Brussman
*Attorney, Agent, or Firm*—Jones, Day, Reavis & Pogue

[57] ABSTRACT

A film forming composition including a film forming substance having amphiphilic molecules and being dispersed in a gel-like carrier having a non-liquid state below about 20° C. The carrier stabilizes the film forming substance, and inhibits diffusion of moisture and oxygen into the composition. This minimizes deterioration of the film forming substance, and also minimizes undesirable formation of agglomerations of such substance. When the composition is applied to a surface, an ultra thin substantially continuous film of substantially uniform thickness forms spontaneously and attaches to the surface. The excess composition is then washed away.

25 Claims, No Drawings

FILM FORMING COMPOSITION

BACKGROUND OF THE INVENTION

This application relates to the art of coating compositions and to methods for providing surfaces with coatings. The invention is particularly applicable to ultra thin films formed by amphiphilic molecules, and will be described with specific reference thereto. However, it will be appreciated that certain features of the invention have broader aspects, and may be used with other types of film forming substances and coating compositions.

Compositions having ingredients that are capable of forming thin films on substrates are discussed in an article entitled Oleophobic Monolayers, by W. C. Bigelow et al., J. Colloid Sci. I, pages 513–538 (1946); in an article entitled Wettability and Conformation of Reactive Polysiloxanes, by Lieng-Huang Lee, Journal of Colloid and Interface Science, Vol. 27, No. 4, August 1968, pages 751–760; in an article entitled Electrical Conduction Through Adsorbed Monolayers, by E. E. Polymeropoulos et al., J. Chem. phys. 69(5), Sept. 1, 1978, pages 1836–1847; and in U.S. Pat. No. 4,539,061 issued Sept. 3, 1985, to Jacob Sagiv, for a Process for the Production of Built-Up Films by the Stepwise Adsorption of Individual Monolayers The disclosures of which are hereby incorporated herein by reference. These compositions use thin solvents in which a film forming substance is soluble. In general, the solvents are toxic and environmentally unsafe. Highly liquid compositions also lose their usefulness very rapidly when exposed to airborne moisture and/or oxygen. Highly reactive materials tend to form molecular agglomerations and precipitate out of solution.

It would be desirable to have a film forming composition that is not noxious or hazardous to persons or the environment, and that would provide optimum protection and stability for a film forming substance in the composition. At the same time, it would be desirable to provide such a composition that is easily applied to substrate surfaces to form a substantially continuous ultra thin film of substantially uniform thickness thereon.

SUMMARY OF THE INVENTION

Film forming substances used in the compositions of the present application are capable of forming films and attaching to substrates by reactions and forces of the type discussed in the aforementioned articles by Bigelow et al., L. H. Lee, E. E. Polymeropoulos et al., and J. Sagiv. The film is chemically bound to a surface on which it forms.

A film forming substance capable of forming a substantially continuous ultra thin film of substantially uniform thickness is dispersed in a carrier having a non-liquid state at temperatures below about 20° C.

Unlike prior arrangements requiring use of a solvent in which a film forming substance is soluble, the present application makes it possible to use a carrier in which the film forming substance is either soluble or insoluble. When using a carrier in which the film forming substance is insoluble, the film forming substance is uniformly dispersed throughout the carrier to provide a substantially homogeneous mixture.

The carrier is preferably non-aqueous and is preferably insoluble in water. However, aqueous carriers may be possible for certain applications. Also, the carrier preferably has a substantially neutral pH, although acidic or basic carriers may be used for certain purposes.

The carrier is preferably a gel or gel-like material which inhibits diffusion of moisture and/or oxygen into the composition to thereby stabilize the film forming substance and minimize deterioration of same.

In the present application, amphiphilic molecules form an ultra thin substantially continuous film of substantially uniform thickness, and attach to a substrate surface from a composition having a gel or gel-like state, instead of a liquid state, at temperatures below about 20° C.

In the most preferred arrangement of the present application, the film forming substance consists essentially of amphiphilic molecules. That is, the film formed on a surface using the composition of the present application is formed solely from amphiphilic molecules in the composition.

Film formed in accordance with the present application is characterized by its substantially uniform thickness not greater than about 0.5 micron.

Compositions of the present application have a preferable consistency range at 25° C. of about 35–400 by the cone penetration test. However, lower consistency can be used, and the consistency is preferably not greater than about 400 at 25° C.

The preferred melting point is higher than about 30° C., and most preferably higher than about 50° C. A preferred melting point range is about 30°–80° C., although higher melting points can be used by preheating the composition and/or the substrate to which it is applied. Lower melting point compositions are preferred for ease of application, and minimize or eliminate the need to preheat the composition and/or substrate.

Compositions of the present application can employ up to about 0.5% by weight of a catalyst, such as zinc chloride, aluminum chloride or mineral acids, to enhance film formation.

Compositions of the present application can employ up to about 0.5% by weight of a quencher, such as one or more of amines, aluminum powder and zinc powder, for reaction with noxious fumes. For example, if the composition uses materials that react to form acid fumes, the quencher will neutralize the acid fumes by forming a salt.

Compositions of the present application are particularly useful for providing ultra thin films on cookware, and especially glass cookware, on glass laboratory ware and on eyewear lenses.

Compositions of the present application can change the surface energy of surfaces to which they are applied.

Preferred films formed in accordance with the present application are substantially invisible unless a dye is added to the composition or incorporated in the amphiphile.

The composition of the present application is applied to a substrate surface, and a substantially continuous ultra thin film of substantially uniform thickness is allowed to form from the amphiphilic molecules in the film forming substance. The molecules also attach themselves to the substrate surface by various forces and bonds as discussed in the aforementioned articles, and are primarily chemically bound to the surface. Subsequently, the excess material is washed away, such as with soap and water. A substantially continuous ultra thin film of substantially uniform thickness remains on the substrate surface, and provides excellent abrasion and stain resistance. The properties imparted to the substrate surface by the film can be varied by selecting different film forming substances.

The method of the present application for providing a substantially continuous ultra thin film of substantially uniform thickness to a substrate surface is essentially carried out in three steps. First, a homogeneous coating composition is made by dispersing a film forming substance in a carrier having a viscosity such that diffusion of moisture and/or oxygen into the composition is inhibited. This stabilizes the film forming substance and minimizes deterioration of same. Small quantities of one or both of a catalyst and quencher may be included in the composition. Second, the composition is applied to a substrate surface. Third, the amphiphilic molecules in the film forming substance are allowed to form a substantially continuous ultra thin film of substantially uniform thickness that attaches to the substrate surface. Film forming substances containing polymerizable moieties are polymerized by heating, photochemical reaction and/or use of a catalyst. Excess coating material is then washed away.

It is a principal object of the present invention to provide an improved coating composition and method for providing ultra thin films on substrate surfaces.

It is another object of the invention to provide a coating composition having a substantially neutral carrier that is environmentally safe and non-toxic to persons.

It is an additional object of the invention to provide an improved coating composition and method for forming ultra thin films in a manner that does not release hazardous materials to the environment, or create a noxious or hazardous environment for workers.

It is a further object of the invention to provide a coating composition containing a film forming substance that is very stable and resistant to deterioration, while being very reactive for film formation.

It is another object of the invention to provide a coating composition having an extremely low moisture content and a very low affinity for moisture.

It is another object of the invention to provide a coating composition that inhibits diffusion of moisture into the composition to thereby minimize deterioration of a film forming substance within the composition.

It is also an object of the invention to provide improved substrate surfaces, such as on cookware, laboratory ware and eyewear lenses.

It is another object of the invention to provide a commercially cost effective composition and method for modifying surface properties of substrates by forming substantially continuous ultra thin films of substantially uniform thickness thereon.

DESCRIPTION OF PREFERRED EMBODIMENTS

As used in this application, a film forming substance is one containing amphiphilic molecules that are capable of forming a substantially continuous ultra thin film of substantially uniform thickness on a substrate surface. In this application, a substantially continuous film is one that is substantially unbroken except for the presence of relatively minor defects or imperfections such as pin holes.

An amphiphile contains a polar region and a non-polar or apolar region. Amphiphiles that can be used to form film in accordance with the present application include, but are not necessarily limited to, the following:

The polar segment of the amphiphile can be a carboxylic acid or its salts, alcohols, thiols, amides, primary, secondary, tertiary amines, cyanides, nitrates, phosphates, silane derivatives, sulfonates and the like.

The non-polar or apolar component typically consists mainly of alkanes or fluorinated alkanes. These apolar regions may include diacetylene, vinyl-unsaturated, or fused linear or branched aromatic moieties. In addition the apolar region may contain organic dyes with or without metal, such as pthalocyanines, porphyrins and phenol blues.

In one preferred arrangement, the film forming substance consists essentially of $R_mSiX_n$ where the non-polar R is an alkyl or fluorinated alkyl group of about 10-30, and most preferably about 14-30, carbon atoms long. The film forming substance, and particularly the alkyl or fluorinated alkyl group, may include one or more of polymerizable moieties, dyes or dipoles. In the above formula, X is selected from the group consisting essentially of halogens, hydroxy and alkoxy. In the formula, m is $0-3$, n is $1-4$, and m plus n equal 4. In still another preferred arrangement, R may be a substituted silane or siloxane.

The film forming substance is thoroughly mixed and uniformly dispersed in a carrier to provide a substantially homogeneous composition. The carrier is preferably one that has a non-liquid state at temperatures below about 20° C. Most preferably, the carrier is one having a substantially neutral pH, although other types of carriers can be used for certain purposes. Most preferably, the carrier is one that meets Food and Drug Administration Regulations 21 CFR 172.880 and 178.3700 for direct and indirect use in food for human consumption.

The carrier used in the composition of the present application is preferably a gel or gel-like material at temperatures below about 20° C. Various grades of petrolatum can be used for the carrier. These petrolatums are of the type used as carriers, emollients, lubricants, base ingredients, binders, protective coatings, plasticizers, waterproofing, release agents, and softeners. The carrier may also be a mineral jelly compounded from white mineral oils, petrolatums and paraffin waxes. The carrier may also be a hydrogenated or partially hydrogenated vegetable or animal oil. Various mixtures of the aforementioned carriers are also possible.

Most preferably, the carrier is one that is not soluble in water. However, carriers that are soluble in water can be used for certain purposes. The carrier may be one in which the film forming substance is insoluble. Other carriers that may be possible for certain purposes include silicone jelly. Water based gels may also be used when the film forming substance does not react with water. The carrier is preferably one that has an extremely low moisture content and most preferably is one that has been rendered anhydrous.

The highly viscous carrier stabilizes the film forming substance by maintaining same randomly dispersed throughout the carrier. The carrier also inhibits absorption of airborne moisture and/or oxygen into the composition.

A small quantity of a catalyst may be uniformly mixed in the composition to enhance film formation. For example, up to about 0.5% by weight of one or more of zinc chloride or mineral acids may be added to the composition. A small quantity of a quencher may also be added to the composition for neutralizing acid fumes formed during film formation. For example, up to about 0.5% by weight of one or more of an amine, aluminum powder or zinc powder may be added to the composition as a quencher that will neutralize acid fumes by forming a salt. When more than one quencher is used, the total amount of quencher material is not more than about 0.5% by weight of the entire composition, and the same relationship is used for the catalyst.

The composition and carrier of the present application have a preferred consistency or firmness as determined by a cone penetration test. Examples of consistency will be given as determined by ASTM designation D937-87 approved Oct. 30, 1987, and published in December 1987, the disclosure of which is hereby incorporated herein by reference. The carrier and composition of the present application preferably have a consistency at 25° C. that is in the range of about 35–400, although a lower consistency can be used when the substrate and/or composition is heated before application of same to a surface.

In the cone penetration test for consistency, higher numbers mean that the material is softer because the cone penetrates further. Thus, a material having a consistency of 35 is much firmer and resistant to penetration than a material having a consistency of 400. The consistency of the carrier and composition is preferably less than about 400. A more preferable range is about 150–300.

The preferred melting point of the composition is higher than about 30° C., and most preferably higher than about 50° C. A preferred melting point range is about 30°–80° C., although higher melting points can be used by heating the composition and/or substrate. Lower melting points are preferable for ease of application of the composition to a surface, while eliminating or minimizing the need to preheat the composition and/or substrate. The melting point may be determined in accordance with ASTM designation D127.

The composition of the present application can be applied to substrate surfaces in any suitable manner, such as by wiping, brushing, rolling, spraying or the use of a doctor blade. The composition can also be foamed as it is applied to a substrate surface or as an article to be coated with film is passed through the foam. The composition can also be vaporized, and articles to be coated with film are passed through the vapor.

To form a substantially continuous ultra thin film of substantially uniform thickness on a substrate surface, the surface is completely covered with the composition. The composition is allowed to remain on the surface for a sufficient period of time to allow the film to form and attach to the surface. The amount of time required for film formation and bonding to the surface depends upon the type of substrate, the consistency of the composition, the temperature and the particular film forming substance being used.

Where the film forming substance contains a polymerizable group, the film may be cured by either heating or exposure to a light source, preferably an ultraviolet light source. Polymerization can be initiated at anywhere from 20° C. to 150° C. Heat may be applied by blowing hot air on the surface or by passing the articles through an oven. Polymerization may be effected during a time period up to about 30 minutes. When X in $R_mSiX_n$ is a halogen, polymerization can be completed in less than one minute and, when a non-halogen, can be substantially completed in up to about 30 minutes Once the film has formed and is attached to the substrate surface, the excess composition is washed away. The excess composition may be removed with a suitable solution, such as soap and water, and then rinsed. A suitable solvent such as mineral oil may also be used to provide an initial rinse for washing away the excess composition. The substrate surface is left with a film having excellent abrasion and stain resistance. The film is substantially invisible unless a dye has been added to the composition or incorporated in the amphiphile.

The composition and method of the present application are particularly advantageous for providing a film of the type described on non-porous substrates, such as glass, plastics, ceramics, porcelain, fiberglass and metals. Film applied in accordance with the present application is relatively permanent in nature, and resists all common household solvents and chemicals, along with food products and cosmetics. The film is hydrophobic, and also has excellent water beading and anti-stick properties. The film is useful for anti-reflective optics, corrosion protection, friction reduction, print priming, moisture barriers, scratch resistance and security marking. The film is particularly advantageous when applied to cookware, and particularly glass or ceramic cookware, to laboratory ware and to eyewear lenses used in eyeglasses.

Film applied with the composition of the present application is useful on any pots, pans, dishes or utensils used for preparing, cooking and serving food. The film is particularly advantageous on such items that are made of glass and are used for cooking, because dried food does not stick to the film.

The film is also advantageous on glass laboratory ware including, but not limited to, laboratory flasks, beakers, test tubes and dishes.

The film is particularly advantageous for use on plastic eyewear lenses, such as aliphatic polycarbonate, used in eyeglasses. An anti-reflective coating and/or scratch resistant coating may be applied to the lenses before the film of the present application is formed thereon. The lenses may have a thin anti-reflective coating of sputtered metal thereon and the film is applied over the anti-reflective coating. The lenses may be hard coated for scratch resistance, such as with a polysiloxane, and the film of the present application is applied over the scratch resistant coating.

In the arrangement of the present application, the sole material that forms the film in-situ on a substrate surface consists essentially of amphiphilic molecules. That is, the sole material in the finished film consists essentially of amphiphilic molecules from the film forming substance. The film is characterized by its highly uniform thickness of not more than about 0.5 microns.

Although the invention has been described with reference to certain preferred embodiments, it is obvious that equivalent alterations and modifications will occur to others skilled in the art upon the reading and understanding of this specification. The present invention includes all such equivalent alterations and modifications, and is limited only by the scope of the claims.

We claim:

1. A composition consisting essentially of a film forming substance and a carrier for said film forming substance, said carrier consisting essentially of a material having a non-liquid gel state at temperatures below about 20° C. and a melting point not greater than about 80° C., said film forming substance being dispersed in said carrier and consisting essentially of polymerizable amphiphilic molecules that automatically separate from said composition and self-assemble into a substantially continuous ultra thin film of substantially uniform thickness not greater than about 0.5 micron on a surface to which said composition is applied, such film being chemically attached to surfaces on which it forms from said composition, the remainder of the composition being readily removable from a surface to which it is applied to leave only the self-assembled film on such surface, said composition having a consistency for allowing ready application thereof to surfaces in continuous covering relationship thereto at temperatures above and below 20° C. wherein the film substance consists essentially of RmSiXn where R is an apolar alkyl or fluorinated alkyl group of about 10–30 carbon atoms, where m plus n equals four, and where X is selected from the group consisting of halogens, hydroxy and alkoxy groups.

2. The composition of claim 1 wherein said carrier has a substantially neutral pH.

3. The composition of claim 1 wherein said film forming substance is insoluble in said carrier.

4. The composition of claim 1 wherein said carrier is immiscible in water.

5. The composition of claim 1 wherein said carrier includes petrolatum.

6. The composition of claim 1 wherein a substantially major portion of said carrier, by percent weight of said composition, comprises petrolatum.

7. The composition of claim 1 wherein said film forming substance comprises about 0.1–20% by weight of said composition.

8. The composition of claim 1 wherein said film forming substance comprises about 1–5% by weight of said composition.

9. The composition of claim 1 wherein R includes one or more of polymerizable moities, dyes or dipoles.

10. The composition of claim 1 wherein said film forming substance is polymerizable by at least one of heat or light.

11. The composition of claim 1 wherein heat polymerization of said film forming substance is at least started at a temperature of about 20°–150° C.

12. The composition of claim 11 wherein said film forming substance is at least partly polymerized at said temperature of about 20°–150° C. when maintained at such temperature for a time period up to about 30 minutes.

13. The composition of claim 1 wherein said film forming substance is photopolymerizable by ultraviolet radiation.

14. The composition of claim 1 including a catalyst for promoting film formation by said film forming substance.

15. The composition of claim 1 including a quencher for neutralizing undesirable reaction by-products resulting from film formation by said film forming substance.

16. The composition of claim 1 wherein said composition has a consistency as measured by an ASTM cone penetration test of between about 35–400 at 25° C.

17. The composition of claim 1 wherein said composition has a consistency as measured by an ASTM cone penetration test of between about 150–300 at 25° C.

18. The composition of claim 1 wherein said composition has a consistency not greater than about 400 at 25° C. as measured by an ASTM cone penetration test.

19. The composition of claim 1 wherein said carrier substantially meets Food and Drug Administration Regulations 21 CFR 172.880 and 178.3700 for direct and indirect use in food for human consumption.

20. A coating composition for providing a transparent abrasion and stain resistant film on substrate surfaces comprising;

a substantially homogeneous mixture of a carrier whose principal ingredient is petrolatum and a film forming substance of polymerizable amphiphilic molecules having polar groups and being capable of spontaneous thin film formation in-situ on a substrate surface when said composition is applied to such surface, said carrier providing protection for said film forming substance and stabilizing same by maintaining said molecules in a substantially disoriented state within said carrier until said composition is applied on a substrate surface whereupon said molecules form in-situ on said surface into a substantially continuous ultra thin film of substantially uniform thickness not greater than about 0.5 micron with said polar groups chemically attached to such surface, said composition being characterized by the absence of solid particulate materials wherein the film substance consists essentially of RmSiXn where R is an apolar alkyl or fluorinated alkyl group of about 10–30 carbon atom, where m plus n equals four, and where X is selected from the group consisting of halogens, hydroxy and alkoxy groups.

21. The composition of claim 20 wherein said nonpolar segment of an alkyl or fluorinated alkyl group includes one or more of polymerizable moieties, dyes and dipoles.

22. A substantially anhydrous composition comprising a film forming substance and a carrier for said film forming substance, said film forming substance comprising polymerizable amphiphilic molecules capable of bonding self-assembly into a substantially continuous ultra thin film of substantially uniform thickness not greater than about 0.5 micron on a surface to which they are applied, said carrier comprising a substantially anhydrous material having a gel state at temperatures below about 20° C., a melting point not greater than about 80° C., and a consistency not greater than about 400 at 25° C., as measured by an ASTM cone penetration test, said film forming substance being dispersed in said carrier, said polymerizable amphiphilic molecules in said film forming substance being automatically separable from said carrier by attractive forces between said molecules and a surface to which said composition is applied for bonding self-assembly on such surface into said ultra thin film, said polymerizable amphiphilic molecules comprising substantially the only ingredient of said composition that forms an adherent permanent coating on a surface to which said composition is applied, said carrier forming no part of an adherent permanent coating on a surface to which said composition is applied and said carrier being readily removable form a surface to which said composition is applied to leave only the ultra thin film formed by said polymerizable amphiphilic molecules wherein the film substance consists essentially of RmSiXn where R is an apolar alkyl or fluorinated alkyl group of about 10–30 carbon atoms, where m plus n equals four, and where X is selected from the group consisting of halogens, hydroxy and alkoxy groups.

23. The composition of claim 22 wherein substantially all of said composition, other than said film forming substance, substantially meets United States Food and Drug Administration Regulations 21 CFR 172.880 and 178.3700 for direct and indirect use in food for human consumption.

24. The composition of claim 22 wherein said carrier has a consistency not less than about 35 at 25° C. as measured by an ASTM cone penetration test.

25. The composition of claim 22 wherein said composition has a consistency between about 150-300 at 25° C. as measured by an ASTM cone penetration test.

* * * * *